(12) United States Patent
Yuda et al.

(10) Patent No.: US 6,445,261 B1
(45) Date of Patent: Sep. 3, 2002

(54) SAW FILTER ANTENNA SHARING DEVICE USING THE SAME, AND MOBILE COMMUNICATION TERMINAL USING THE SAME

(75) Inventors: Naoki Yuda; Toru Sakuragawa; Ryouichi Takayama; Kozo Murakami; Yuki Satoh, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/463,113
(22) PCT Filed: May 17, 1999
(86) PCT No.: PCT/JP99/02558
§ 371 (c)(1),
(2), (4) Date: Apr. 13, 2000
(87) PCT Pub. No.: WO99/60700
PCT Pub. Date: Nov. 25, 1999

(30) Foreign Application Priority Data

May 19, 1998 (JP) .............................. 10-136412
Sep. 11, 1998 (JP) .............................. 10-258251

(51) Int. Cl.$^7$ .............................. H03H 9/64; H03H 9/72
(52) U.S. Cl. .................... 333/133; 333/193; 333/195
(58) Field of Search ...................... 333/133, 193–196

(56) References Cited

U.S. PATENT DOCUMENTS

| 5,543,757 A | * | 8/1996 | Kobayashi et al. | ..... 333/193 X |
| 5,631,612 A | * | 5/1997 | Satoh et al. | ................. 333/193 |
| 5,831,493 A | | 11/1998 | Ushiroku | .................... 333/193 |

FOREIGN PATENT DOCUMENTS

| JP | 61-24412 | | 2/1986 | |
| JP | 02-500236 | | 1/1990 | |
| JP | 4-16014 | * | 1/1992 | ................. 333/133 |
| JP | 6-13837 | * | 1/1994 | |
| JP | 07-74584 | | 3/1995 | |
| JP | 7-154201 | * | 6/1995 | |
| JP | 07-212182 | | 8/1995 | |
| JP | 9-55640 | | 2/1997 | |
| JP | 9-83214 | * | 3/1997 | |
| JP | 09-102728 | | 4/1997 | |
| JP | 09-172340 | | 6/1997 | |
| JP | 10-200363 | | 7/1998 | |
| WO | WO 88/10012 | | 12/1988 | |

OTHER PUBLICATIONS

Y. Konishi, "Microha kairo no kiso chisiki (Introduction to Microwave Circuit)" Feb. 10, 1987, 4$^{th}$ Ed. p. 162 (w/English translation).
S. Furukawa, "Microstrip senro (2) (Microstrip Line)", Mar. 1975, pp. 305–310.
English translation of Form PCT/ISA/210, International Search Report, Aug. 10, 1999.

* cited by examiner

Primary Examiner—Robert Pascal
Assistant Examiner—Barbara Summons
(74) Attorney, Agent, or Firm—RatnerPrestia

(57) ABSTRACT

The invention relates to a SAW filter, an antenna duplexer using the same, and a mobile communication terminal using the same, and assures a high withstanding power characteristic and a sufficient isolation between transmitting terminal and receiving terminal.

The invention relates to a ladder-type SAW filter composed by alternately connecting a serial branch having at least one SAW resonator connected in series to a signal path, and a parallel branch having at least one SAW resonator connected between the signal path and the ground, in which the sizes of wiring patterns of the parallel branch are smaller than wiring patterns of the serial branch. Therefore, in the case of the serial-branch input type, inductive components of the parallel-branch wiring patterns can be decreased, so that a large reflection coefficient may be obtained in the rejection band.

12 Claims, 16 Drawing Sheets

Frequency
Start 800MHz
Stop 950MHz

Frequency
849MHz

Frequency
Start 800MHz
Stop 950MHz sie
SAW FILTER ANTENNA SHARING DEVICE USING THE SAME, AND MOBILE COMMUNICATION TERMINAL USING THE SAME This application is a U.S. National Phase Application of PCT International Application PCT/JP99/02558.

DESCRIPTION

1. Technical Field

The present invention relates to a Surface Acoustic Wave (hereinafter called SAW) filter used in a mobile phone or the like, an antenna duplexer using the same, and a mobile communication terminal using the same.

2. Prior Art

Generally, the SAW filter used in the radio frequency spectrum such as used by a mobile phone typically includes a ladder-type circuit to realize a band-pass filter of small size and high selectivity. Hitherto, these types of ladder-type SAW filter was constituted as shown in FIG. 17 as disclosed in Japanese Laid-open Patent No. 9-102728.

That is, serial-branch SAW resonators 12-1 to 12-4 include reflectors 15 sandwiching an interdigital transducer 14 are arranged at the left side (the side of L0) in the drawing on a piezoelectric substrate 13, and are connected by serial-branch wiring patterns 16-1 to 16-3. On the other hand, parallel-branch SAW resonators 12-5 to 12-7 including reflectors 15 sandwiching an interdigital transducer 14 are arranged at the right side (the side of L1) and are connected to the serial-branch wiring patterns 16-1 to 16-3 by parallel-branch wiring patterns 16-4 to 16-6.

In this constitution, a seven-element ladder-type SAW filter 11 is formed. This SAW filter 11 has a circuit configuration in which the input electrode 16-8 side starts from the serial-branch SAW resonator 12-1. Such circuit configuration is called the serial-branch input type. By contrast, the circuit configuration in which the input side starts from the parallel-branch SAW resonator is called the parallel-branch input type.

The conventional ladder-type SAW filter 11 tends to be less in increase of reflection coefficient at the input electrode 16-8 even outside of the pass band. FIG. 18 is a polar coordinate chart of reflection coefficient as seen from the input electrode 16-8 of a receiving filter e.g. a receiving filter for Advance Mobile Phone Service (hereinafter called AMPS) which is a mobile phone system in the United States. The receiving band, that is, the pass-band is 869 MHz to 894 MHz (marker M1 to M2), and the transmitting band to be rejected at the receiving input terminal is 824 MHz to 849 MHz (marker M3 to M4).

As known from FIG. 18, at the upper end M4 of the transmitting band, the reflection coefficient of only about 0.8 is obtained. The cause is the inductive components of the parallel-branch wiring patterns 16-4 to 16-6 as explained in detail later in the embodiment. In the case of serial-branch input type, in particular, since the SAW resonators 12-1 to 12-7 are arranged as shown in FIG. 17 for the convenience of constitution, the parallel-branch wiring pattern is extended in length, and this tendency appears obviously.

The use of this ladder-type SAW filter 11 in an antenna duplexer is explained below. The antenna duplexer is a branching filter comprising a transmitting terminal, an antenna terminal, and a receiving terminal, and a transmitting filter is placed between the transmitting terminal and the antenna terminal, and a receiving filter is placed between the antenna terminal and the receiving terminal.

Moreover, phase shifters are provided between the antenna terminal and transmitting filter, and between the antenna terminal and receiving filter, in order to heighten the impedance as seen from the antenna terminal in the rejection band, and thereby suppressing leak of a receiving signal toward the transmitting terminal and a transmitting signal toward the receiving terminal, respectively (that is, isolation is assured).

In this constitution, the transmitting signal entering from the transmitting terminal is output to the antenna terminal without leaking to the receiving terminal. Likewise, the receiving signal entering from the antenna terminal is input into the receiving terminal without leaking to the transmitting terminal.

Generally, as the transmitting filter, a band-rejection filter is used because it is enough to reject only the receiving band, while a band-pass filter is used for the receiving filter because it is required to reject not only the transmitting frequency, but also the neighborhood band of local oscillator frequency and image frequency of the receiving signal.

Therefore, the ladder-type SAW filter of small size and high selectivity has optimum features as the receiving filter. However, when the SAW filter is used as the receiving filter, an electric power of about one watt is applied to the transmitting band which is the rejection band allocated in the lower outside of receiving band, and therefore a corresponding withstanding power is needed. As mentioned in detail below in the embodiment, when the circuit is composed in the serial-branch input type, the withstanding power to the transmitting power is enhanced, and problems are practically solved.

However, when the conventional SAW filter 11 is used as the receiving filter for the antenna duplexer, since the reflection coefficient is small at the transmitting frequency to be rejected, the impedance when seeing the receiving filter from the antenna terminal through the phase shifter is not sufficiently high, and the isolation between transmitting terminal and receiving terminal may not be assured.

DISCLOSURE OF THE INVENTION

The invention is intended to solve the above problems, and it is hence an object thereof to realize not only a SAW filter capable of obtaining a high reflection coefficient in rejection band even in the case of the serial-branch input type with high withstanding power, but also a SAW filter capable of obtaining a high withstanding power characteristic against the transmitting power and assuring a sufficient isolation between the transmitting terminal and receiving terminal when used as the receiving filter for an antenna duplexer, and the object also includes to realize an antenna duplexer using the SAW filter and a mobile communication terminal using the same.

To solve the problems, the invention presents a ladder-type SAW filter composed by connecting alternately a serial branch having at least one SAW resonator connected in series to a signal path, and a parallel branch having at least one SAW resonator connected between the signal path and the ground, in which the sizes of wiring patterns of the parallel branch are smaller than wiring patterns of the serial branch.

According to this constitution, even in the case of serial-branch input type, the inductive components of the parallel-branch wiring patterns are small, and hence a large reflection coefficient is obtained in the rejection band, thereby realizing a SAW filter with a high withstanding power characteristics and assuring a sufficient isolation between the transmitting terminal and receiving terminal, and also an antenna duplexer using the same and a mobile communication terminal using the same.

DETAILED DESCRIPTION OF PREFERRED EMBODIMENTS

Figure 1:
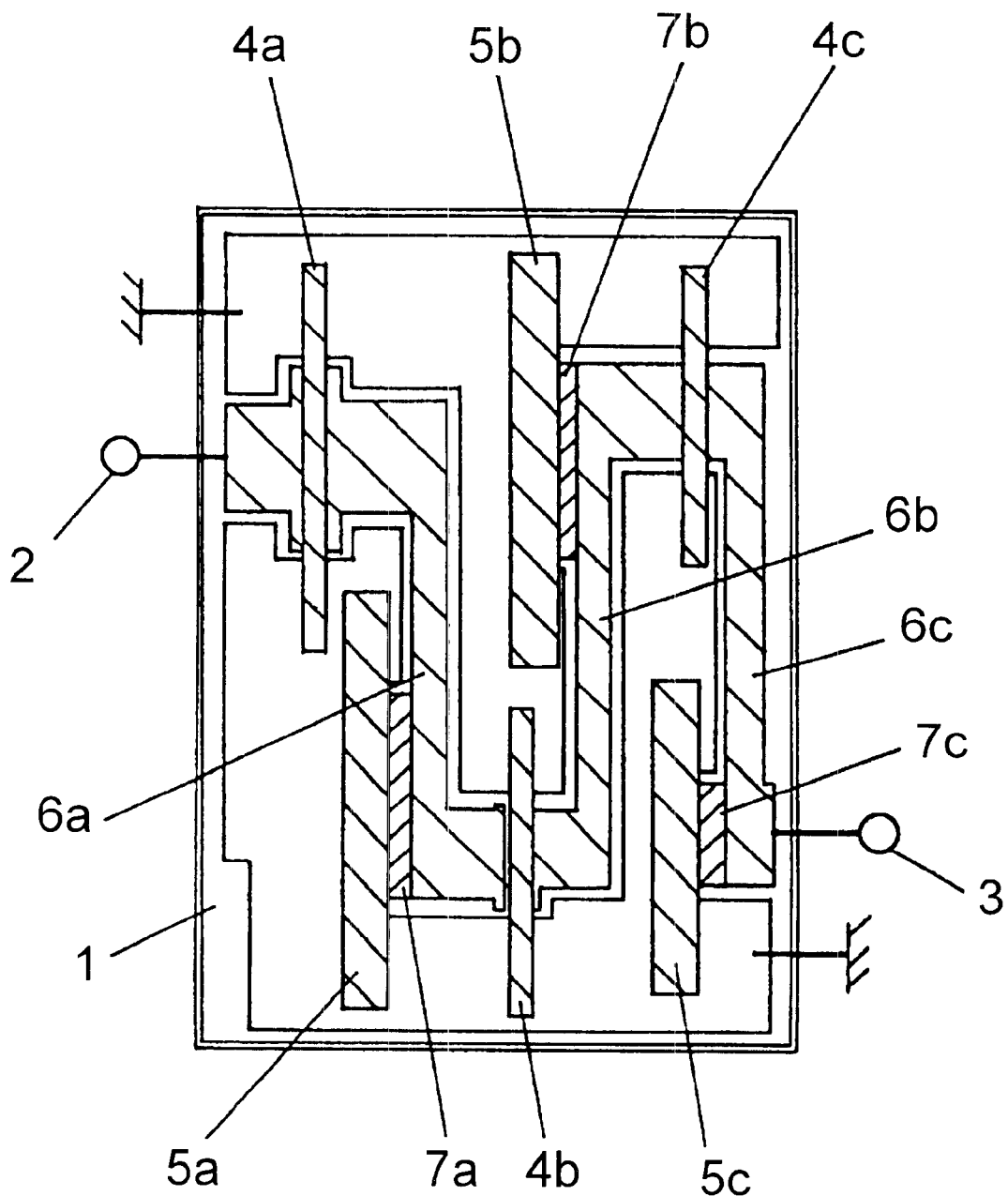
FIG. 1 is a structural diagram showing a constitution of a SAW filter in a first embodiment of the invention.

The SAW filter of the invention is a ladder-type SAW filter composed by connecting alternately a serial branch having at least one SAW resonator connected in series to a signal path, and a parallel branch having at least one SAW resonator connected between the signal path and the ground, and by setting the sizes of wiring patterns of the parallel branch smaller than wiring patterns of the serial branch, even in the case of serial-branch input type, the inductive components of the parallel-branch wiring patterns are small, and a large reflection coefficient is obtained in the rejection band, thereby realizing a SAW filter with a high withstanding power characteristics when used in the antenna duplexer, and assuring a sufficient isolation between the transmitting terminal and receiving terminal.

Preferably, the wiring pattern of the parallel branch is linear, and the wiring pattern of the serial branch is bent at the connection point with the wiring pattern of the parallel branch, and therefore the SAW filter can be placed on the piezoelectric substrate with decreased vacant areas, and a small-sized filter is obtained.

Preferably, the serial-branch SAW resonators and parallel-branch SAW resonators are arranged alternately at one side on the piezoelectric substrate, and the parallel-branch SAW resonators and serial-branch SAW resonators are arranged alternately at the other side, and by zigzag configuration so that the serial-branch wiring patterns and these serial-branch SAW resonators are connected sequentially, the ladder-type SAW filter circuit can be placed on the piezoelectric substrate with decreased vacant areas, so that a small-sized filter is realized.

Preferably, by constituting so that the input terminal side may start from the serial branch, the serial-branch resonator of the first stage functions as a capacitive impedance component, and a part of the input power is reflected by this, and damage of electrodes does not occur, so that a stable characteristic may be maintained.

Preferably, by composing the input side first stage of serial-branch SAW resonators, forming the number of SAW resonators in the serial branch of the input side first stage in plural stages, the rf voltage applied to the serial branches of the input side first stage can be distributed into plural SAW resonators and reduced, and thereby suppressing generation of discharge, so that a stable withstanding power characteristic is realized even in high rf power.

Preferably, by composing the input side first stage of serial-branch SAW resonators, and forming the number of SAW resonators in the serial branch connected to the SAW resonators disposed at the closest position to the input side of the parallel-branch SAW resonator in plural stages, if a high power is applied, a high rf power is applied near the resonating point of the parallel-branch SAW resonator closest to the input electrode connected to the resonator of the serial branch of the first stage, and thereby suppressing discharge at the SAW resonator of the serial-branch connected with the SAW resonator of the parallel branch connected thereto by the pyroelectric charge generated by heat generation in the area, and therefore a stable withstanding power characteristic is realized even in high rf power.

Preferably, by composing the input side first stage of serial-branch SAW resonators, and connecting the signal path linking the parallel-branch SAW resonators disposed at the position closest to the input side and the serial-branch SAW resonators to the ground with high impedance, without allowing leak of rf signal, when a high power is applied, the pyroelectric charge generated at the parallel-branch SAW resonator closest to the input electrode connected to the serial-branch resonator of the first stage can be released to the ground, thereby suppressing discharge generated in the serial-branch SAW resonators connected to the parallel-branch SAW resonators, so that a stable withstanding power characteristic is realized even in high rf power.

Preferably, by applying a bend transformation to the wiring pattern of the aforesaid SAW filter, the reflection in the wiring patterns is reduced, and a stable withstanding power characteristic is obtained in high rf power, and a filter with low insertion loss is realized.

Preferably, by composing the antenna duplexer by placing the aforesaid SAW filter between the antenna terminal and receiving terminal, the antenna duplexer heightened in the withstanding power and sufficiently assured in the isolation between transmitting the terminal and receiving terminal can be realized in a small size.

Preferably, by disposing a high-pass filter type phase filter between the antenna terminal and receiving filter and composing the antenna duplexer, in the case of serial-branch input type, the input impedance in the transmitting band to be rejected may be capacitive, but in this constitution the phase of the impedance seeing the receiving filter from the antenna terminal can be rotated toward the direction of leading phase, and the number of elements of the phase shifter may be minimized, so that a small-sized antenna duplexer can be realized.

Preferably, by composing the phase shifter in a π-circuit of series capacitance and shunt inductance, the number of component of the phase shifter may be minimized, and a small-sized antenna duplexer may be realized.

Preferably, by composing the phase shifter in a T-circuit of series capacitance and shunt inductance, the number of component of the phase shifter may be minimized, and a small-sized antenna duplexer may be realized.

Preferably, by using the aforesaid antenna duplexer in the antenna duplexer portion of the mobile communication apparatus terminal in which a large-sized dielectric-loaded coaxial resonator was used hitherto due to the problem of the withstanding power characteristics, the mobile terminal can be reduced in size and weight.

Exemplary Embodiment 1

A first embodiment of the invention is described below while referring to the drawings. FIG. 1 is a structural diagram showing a SAW filter of the embodiment. In FIG. 1, reference numeral 1 is a piezoelectric substrate, 2 is an input terminal, 3 is an output terminal, 4a to 4c are first to third serial-branch SAW resonators, 5a to 5c are first to third parallel-branch SAW, resonators, 6a to 6c are first to third serial-branch wiring patterns, and 7a to 7c are first to third parallel-branch wiring patterns.

Figure 2:
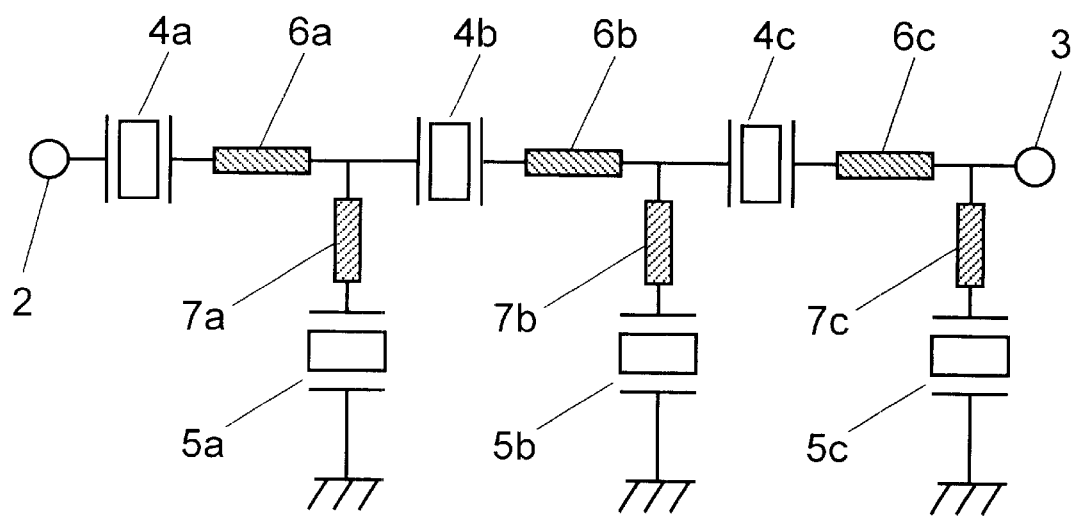
FIG. 2 is a circuit diagram showing the constitution of the SAW filter.

The piezoelectric substrate 1 is a lithium tantalate substrate in 36° Y-cut, and all SAW resonators and wiring patterns are formed of alloyed electrodes of aluminum and 1 wt. % copper. In the constitution in FIG. 1, the six-element ladder-type SAW filter circuit in FIG. 2 is formed.

The invention is not limited to the materials of this embodiment alone, but the piezoelectric substrate 1 may be made of a 39° Y-cut lithium tantalate substrate, or the electrodes may be formed by alternately accumulating titanium and aluminum in order to enhance the withstanding power characteristics, or formed by alternately accumulating titanium and Al—Cu alloy or formed by alternately accumulating titanium and Al—Sc—Cu alloy, and the same effects as in the embodiment are obtained.

In the diagrams, the circuit configuration of this SAW filter is a serial-branch input type starting from a first serial-branch SAW resonator 4a at the side of input terminal 2. According to the layout of the SAW resonators, the first serial-branch SAW resonator 4a, second parallel-branch SAW resonator 5b, and third serial-branch SAW resonator 4c are arranged at the upper side in the drawing of the piezoelectric substrate 1, and similarly first parallel-branch SAW resonator 6a, second serial-branch SAW resonator 4b, and third parallel-branch SAW resonator 5c are arranged at the lower side. First to third serial-branch wiring patterns 6a to 6c are arranged zigzag to connect the first to third serial-branch SAW resonators 4a to 4c sequentially, and are bent at the connection points with first to third parallel-branch wiring patterns 7a to 7c.

As a result of this constitution, the first to third parallel-branch wiring patterns 7a to 7c are linear, and their lengths are shorter than the lengths of the first to third serial-branch wiring patterns 6a to 6c, respectively. Moreover, the first to third serial-branch SAW resonators 4a to 4c and first to third parallel-branch SAW resonators 6a to 5c are placed on the piezoelectric substrate 1 with decreased vacant areas, and therefore the size of the piezoelectric substrate 1 is 1.6×2.2 mm, same as in the case of the constitution of the prior art.

Figure 3:
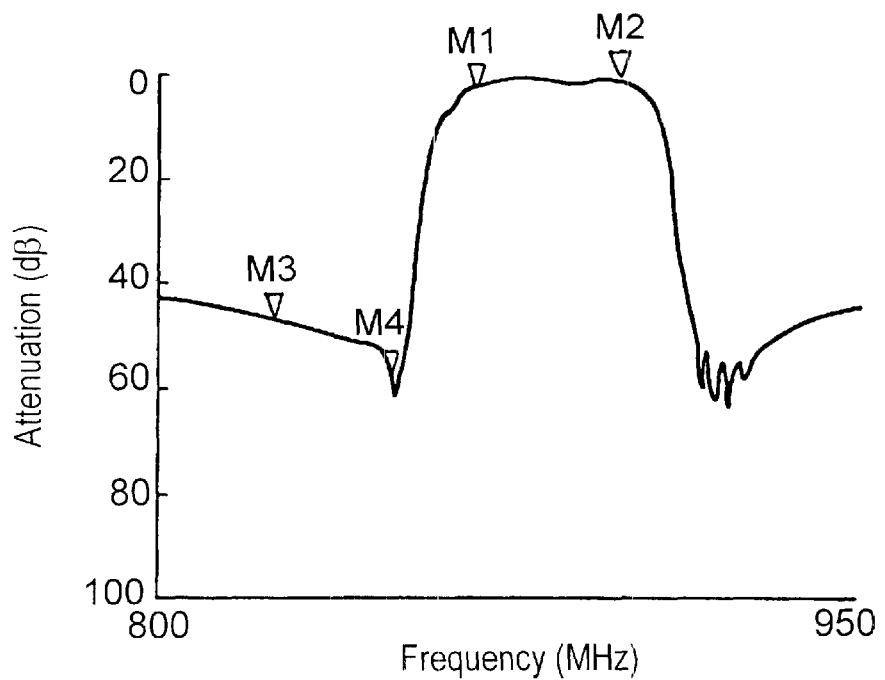
FIG. 3 is a frequency characteristic diagram of pass-band of the SAW filter.
Figure 4:
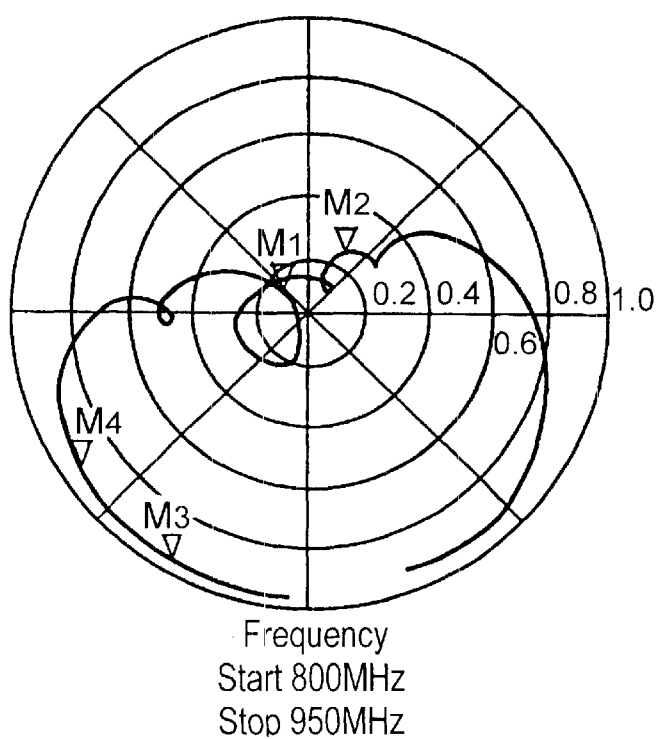
FIG. 4 is a polar coordinate chart showing behavior of reflection coefficient at the input terminal of the SAW filter.

The characteristics of the SAW filter having such constitution are described below. FIG. 3 is a frequency characteristic diagram of pass-band of this SAW filter, and FIG. 4 is a polar coordinate chart showing the reflection coefficient at the input terminal 2 of the same. As shown in FIG. 3, this filter is a band-pass filter having a pass-band in a range from 869 MHz to 894 MHz (marker M1 to M2), which corresponds to the receiving filter of the AMPS of the United States mobile telephone system. The transmitting band to be rejected at receiving input terminal is from 824 MHz to 849 MHz (marker M3 to M4) which are allocated in the lower outside of receiving band, and the attenuation in this band is assured to be 40 dB or more.

Figure 18:
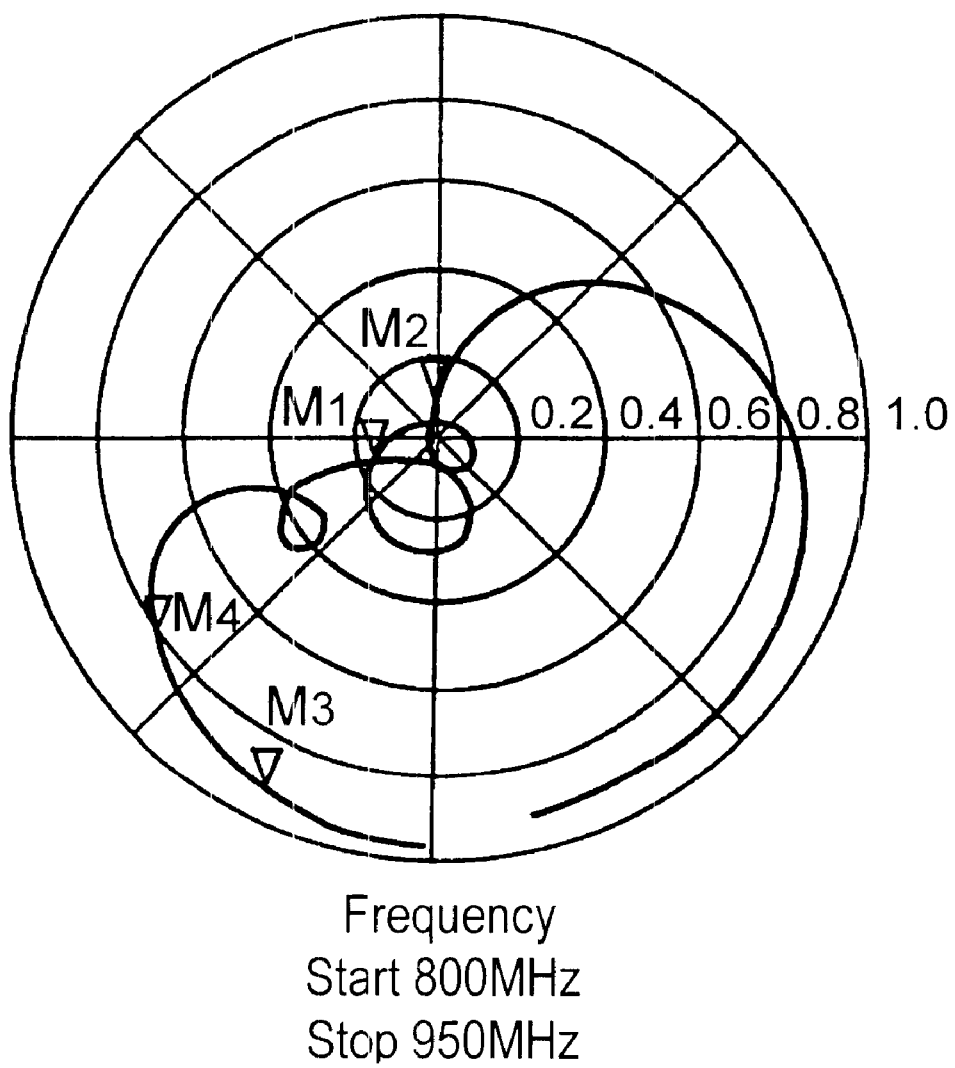
FIG. 18 is a polar coordinate chart showing behavior of reflection coefficient at the input terminal of the SAW filter.

The polar coordinate chart in FIG. 4 is plotting of reflection coefficient at the input terminal 2, and the distance from the center denotes the magnitude of the reflection, and the angle represents the phase of the reflection. As shown in FIG. 4, from marker M1 to M2 in the receiving band, a pass-band is formed as being matched at the reflection coefficient of 0.3 or less. The reflection coefficient in the rejection band (marker M3 to M4) in the lower outside of receiving band is a reflection coefficient of 0.9 or more. This is an improvement of more than 10% as compared with the reflection coefficient of the conventional SAW filter (See FIG. 18).

Figure 5A:
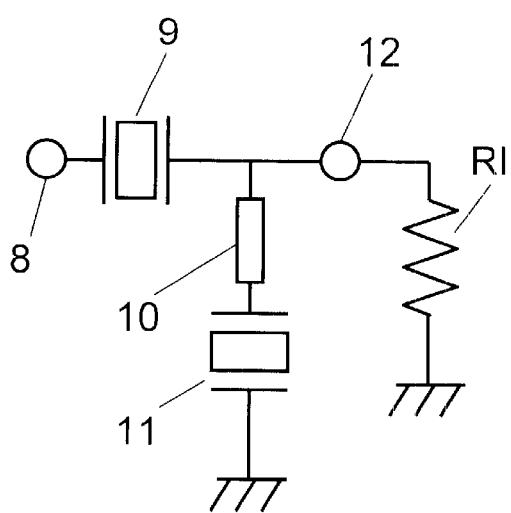
FIG. 5 (*a*) is a circuit diagram showing a two-element L-circuit, and FIG. 5 (*b*) is a circuit diagram showing an equivalent circuit in the rejection band in the lower outside of receiving band.
Figure 5B:
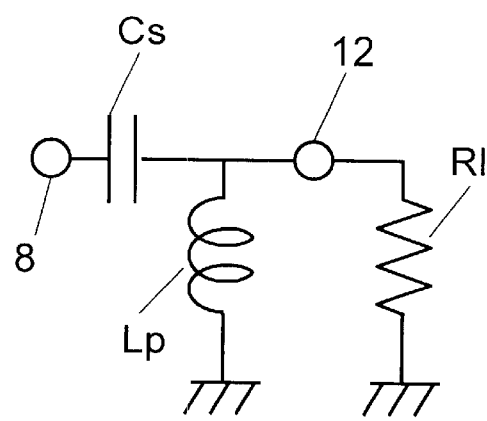

The reflection coefficient of this transmitting band is discussed below. To simplify the circuit, a two-element L-circuit is assumed as shown in FIG. 5. The six-element ladder-type circuit in FIG. 2 may be regarded to be a set of L-circuits, and therefore the behavior of the reflection coefficient may be regarded to be the same. As shown in FIG. 5 (a), in this L-circuit, a serial-branch SAW resonator 9 is connected at the side of input terminal 8, and a parallel-branch SAW resonator 11 is connected to its output side through a parallel-branch wiring pattern 10, with one end being grounded. At the output terminal 12, a load impedance R1 matched with the impedance of the signal source is connected. An equivalent circuit of this L-circuit in the rejection band in the lower outside of receiving band (marker M4 in FIG. 4) is as shown in FIG. 5 (b).

That is, the serial-branch SAW resonator 9 is a capacitive impedance component in the lower outside of receiving band, and is hence equivalently expressed as a capacitor Cs, and the parallel-branch wiring pattern 10 is inductive, and is hence equivalently expressed as inductor Lp. Further, since the parallel-branch SAW resonator 11 is in series-resonating state, and is hence short-circuited, and the inductor Lp is grounded directly. This behavior of reflection coefficient of the L-circuit is shown in FIG. 6.

The reflection coefficient at central point O on the polar coordinate chart at the output terminal 12 rotates counterclockwise on an equi-conductance circle toward the point of reflection coefficient of 1 and phase of 180° (i. e. short-circuited state) by the action of the shunt inductor Lp. At this time, the smaller the Lp, the closer it is to the short-circuited state, and therefore it reaches point A when the Lp is small, or point A' when the Lp is large. On the other hand, by the series capacitor Cs, it rotates counterclockwise on an equi-resistance circle, and reaches point B when the Lp is small, or point B' when the Lp is large. This point is the reflection coefficient at the input terminal 8.

Figure 6:
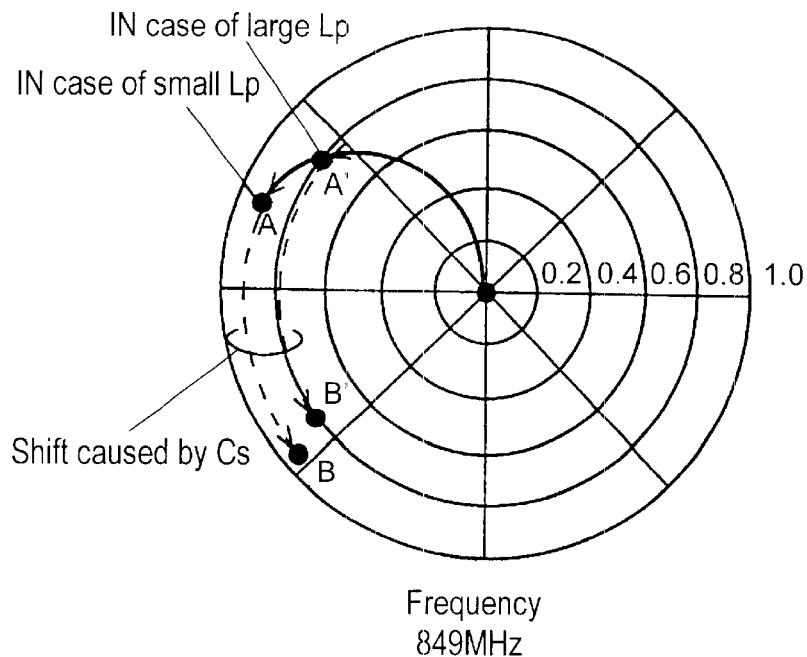
FIG. 6 is a polar coordinate chart showing behavior of reflection coefficient at the input terminal of the L-circuit.

As clearly shown in FIG. 6, the reflection coefficient is close to the circumference of the polar coordinate chart when the inductive component Lp is smaller due to the parallel-branch wiring pattern 10, so that a large reflection coefficient is obtained. Therefore, by shortening the length of the parallel-branch wiring pattern 10 and decreasing the shunt inductance Lp, the reflection coefficient outside of the pass-band can be increased. In the constitution of the SAW filter of the embodiment shown in FIG. 1, the length of the parallel-branch wiring pattern 7a to 7c is minimized, and therefore in spite of the serial-branch input type, the reflection coefficient of 0.9 or more is obtained in the transmitting band.

Figure 7:
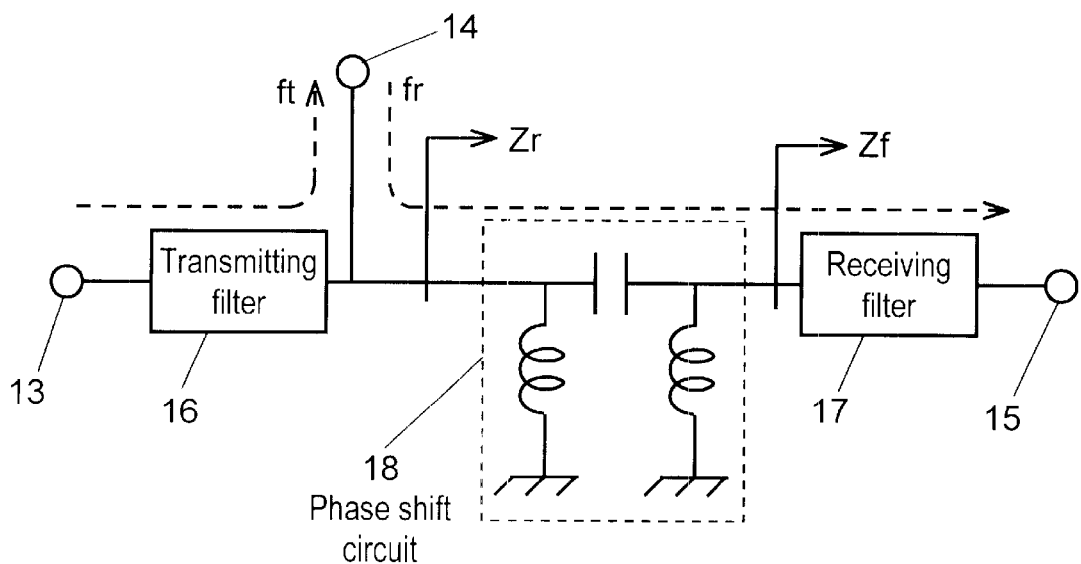
FIG. 7 is a block diagram showing an antenna duplexer using the SAW filter.

The antenna duplexer using the SAW filter of the embodiment is described below. FIG. 7 is a block diagram of the antenna duplexer using the SAW filter of the embodiment. In FIG. 7, reference numeral 13 is a transmitting terminal, 14 is an antenna terminal, 15 is a receiving terminal, 16 is a transmitting filter, 17 is a receiving filter, and 18 is a phase shifter.

The transmitting filter 16 is a filter placed between the transmitting terminal 13 and antenna terminal 14, and has a function of passing the transmitting frequency ft and rejecting the receiving frequency fr, but it is not directly related with the embodiment and detailed description is omitted. The receiving filter 17 is a filter placed between the antenna terminal 14 and receiving terminal 15, and has a function of passing the receiving frequency fr and rejecting the transmitting frequency ft, and the SAW filter of the embodiment is used at this position.

In the case of AMPS or Global Standard for Mobile Communication (hereinafter called GSM), since the transmitting frequency ft is lower than the receiving frequency fr, a transmitting power of about 1 W in usual cases or about 2 W in an instantaneous case will be applied at the input side of the receiving filter 17 in the rejection band in the lower outside of receiving band in the case of AMPS, or a burst wave with ⅛ duty ratio for 4.64 ms and a transmitting power of about 2 W in usual cases or about 4 W in an instantaneous case will be applied at the input side in the rejection band in the lower outside of receiving band in the case of GSM.

Therefore, the receiving filter 17 is required to have a withstanding power characteristic enough to withstand the transmitting power applied in the rejection band in the lower outside of receiving band, and also to reflect the applied transmitting power without absorption (that is, with a large reflection coefficient). Since the SAW filter of the embodiment is of serial-branch input type, it has a high in the withstanding power characteristic, and the reflection coefficient in the rejection band in the lower outside of receiving band of 0.9 or more is assured as stated above, and it is a filter ideal for this application.

Herein, the excellent withstanding power characteristic of this serial-branch input type in the rejection band in the lower outside of receiving band is explained by referring to the basic L-circuit shown in FIG. 5. As shown in the equivalent circuit in the rejection band in the lower outside of receiving band in FIG. 5, in this band, the parallel-branch SAW resonator 11 is in series-resonating state, and hence it is nearly in short-circuited state. Therefore, in the case of parallel-branch input type, the applied power is directly applied there, and an excess current flows, and the comb-shaped electrodes composing the resonator may cause migration and deteriorate in characteristics.

By contrast, in the serial-branch input type, the serial-branch SAW resonator 9 of the first stage functions as a capacitive impedance component, and reflects part of the input power, thereby preventing excess current from flowing into the parallel-branch SAW resonator 11, and therefore the comb-shaped electrodes may maintain stable characteristics without causing migration.

Figure 8:
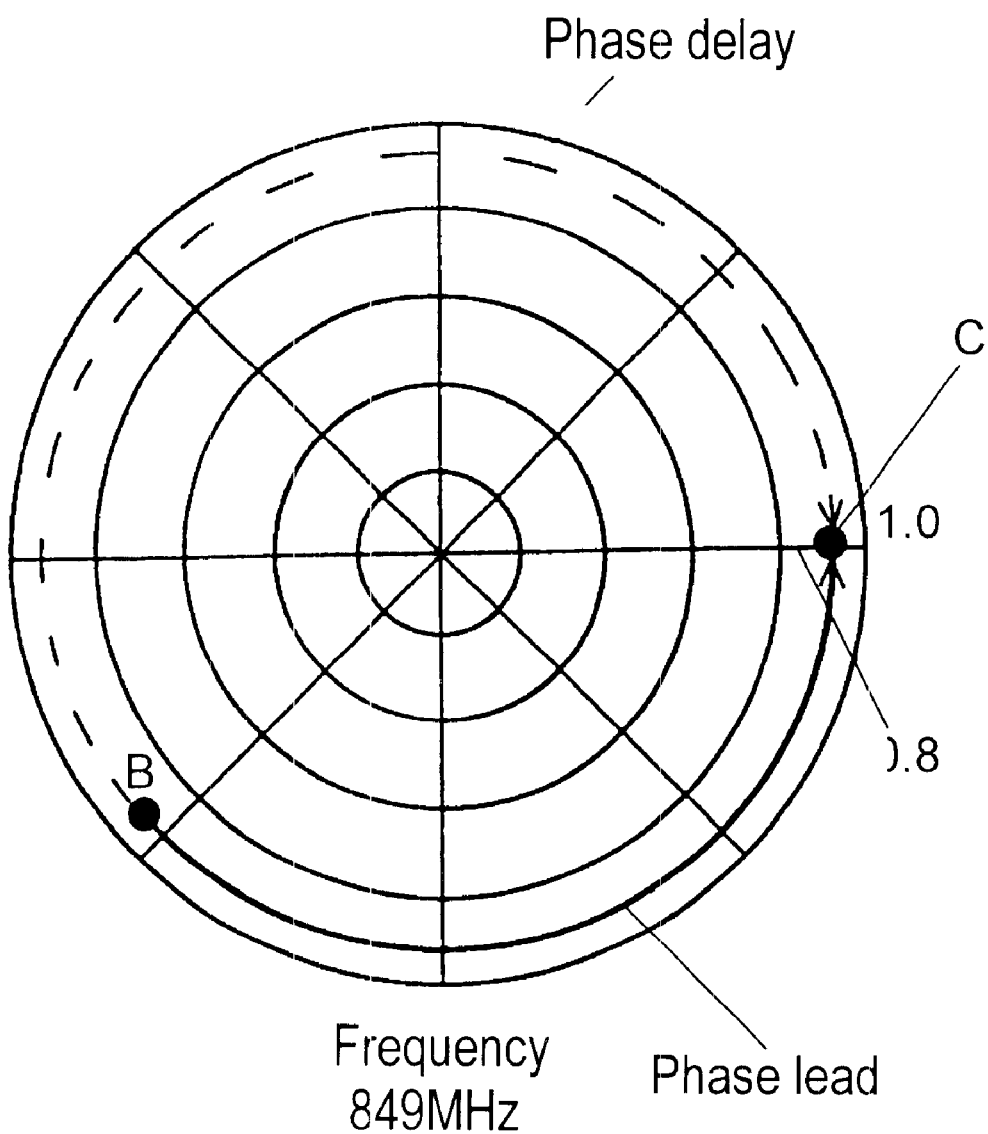
FIG. 8 is a polar coordinate chart showing behavior of reflection coefficient at the receiving terminal of the SAW filter.

The phase shifter 18 is intended to heighten the impedance Zr as seeing the receiving side from the antenna terminal 14. In the receiving filter 17 using the SAW filter of the embodiment as mentioned above, the reflection coefficient as seen from the input side in the rejection band in the lower outside of receiving band is present on point B of the polar coordinate chart in FIG. 8. It shows that the input impedance Zf in this band is capacitive.

To obtain a high impedance, the phase must be rotated to point C close to reflection coefficient of 1 and phase of 0° (i. e. open-circuited state) by the phase shifter. The phase rotating method is either clockwise rotation (lagging phase) as indicated by a broken curve in FIG. 8, and or counter-clockwise rotation (leading phase) as indicated by a solid curve in FIG. 8. The lagging phase rotating circuit is a low-pass filter type, and the leading phase rotating circuit is a high-pass filter type, and the number of elements required is three when the rotating phase is less than 180, and five when 180° or more. Therefore in the capacitive input impedance of the present case, only three elements are required when rotating in the leading phase side by using the phase shifter of the high-pass filter type.

Owing to this reason, in the present embodiment, the three-element high-pass filter type phase shifter 18 of shunt inductor and series capacitance is used in the receiving filter 17 of serial-branch input type. Since the number of elements of the phase shifter 18 is small, the antenna duplexer of small size and low cost is realized, furthermore since the signal loss due to elements is reduced, the insertion loss is also small.

In this constitution, the isolation between transmitting terminal and receiving terminal of the antenna duplexer is 45 dB or more, and an excellent withstanding power characteristic is obtained, that is, deterioration of characteristics does not occur if a transmitting power of 1 watt is applied for 10,000 hours.

In the embodiment, the number of elements of the ladder-type SAW filter is six, but the number of elements is not limited. The attenuation characteristic is steeper when the number of elements is greater, and the insertion loss is smaller when the number of elements is smaller, and therefore the number may be determined on the basis of the required performance. The effects of the invention, that is, the high reflection coefficient in off-band and withstanding power characteristic are exhibited regardless of the number of elements.

In the embodiment, the phase shifter 18 is composed as a π-type high-pass filter, but same effects are obtained in other constitution of T-type high-pass filter.

Exemplary Embodiment 2

Figure 9:
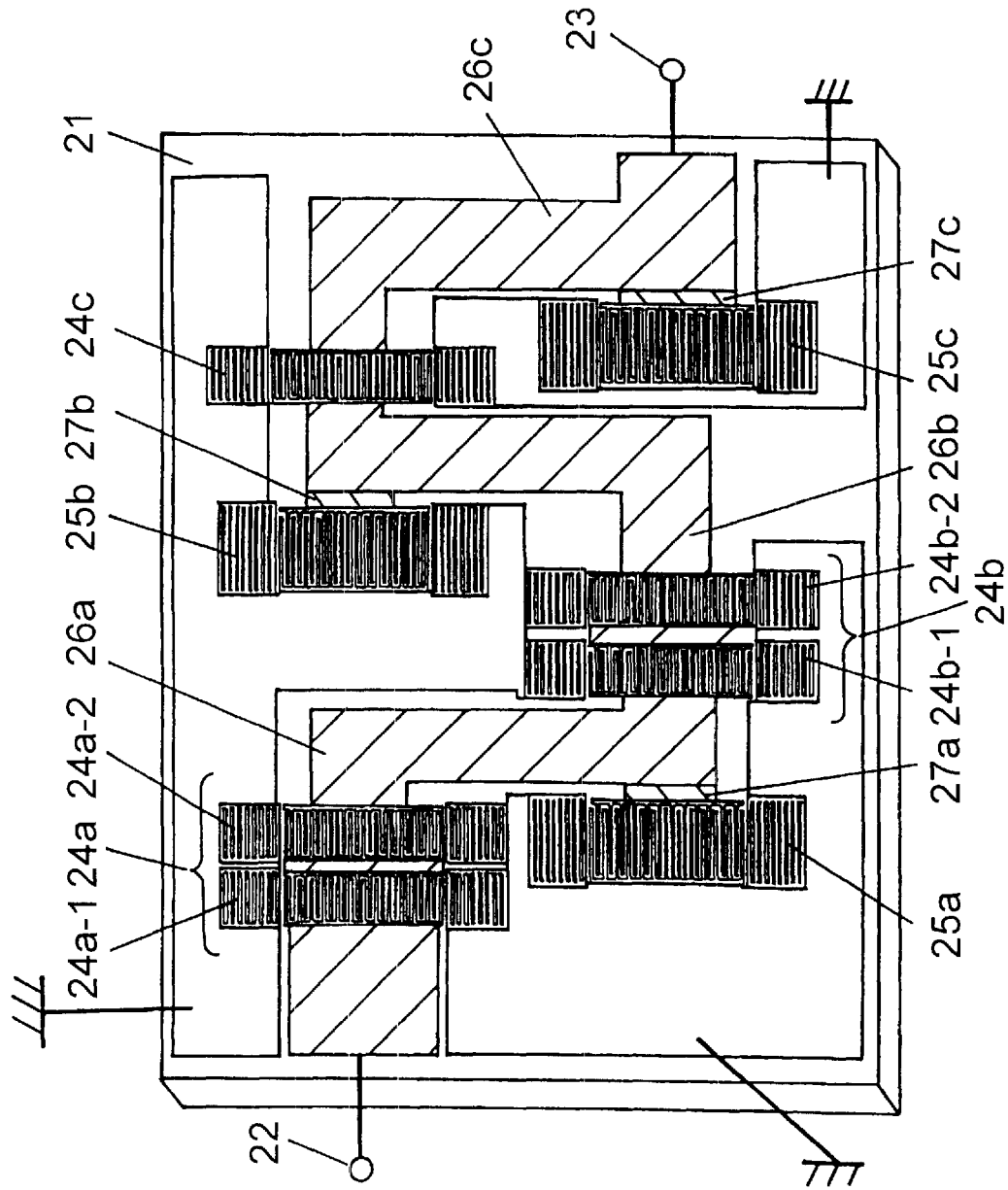
FIG. 9 is a structural diagram showing a constitution of a SAW filter in a second embodiment of the invention.
Figure 10:
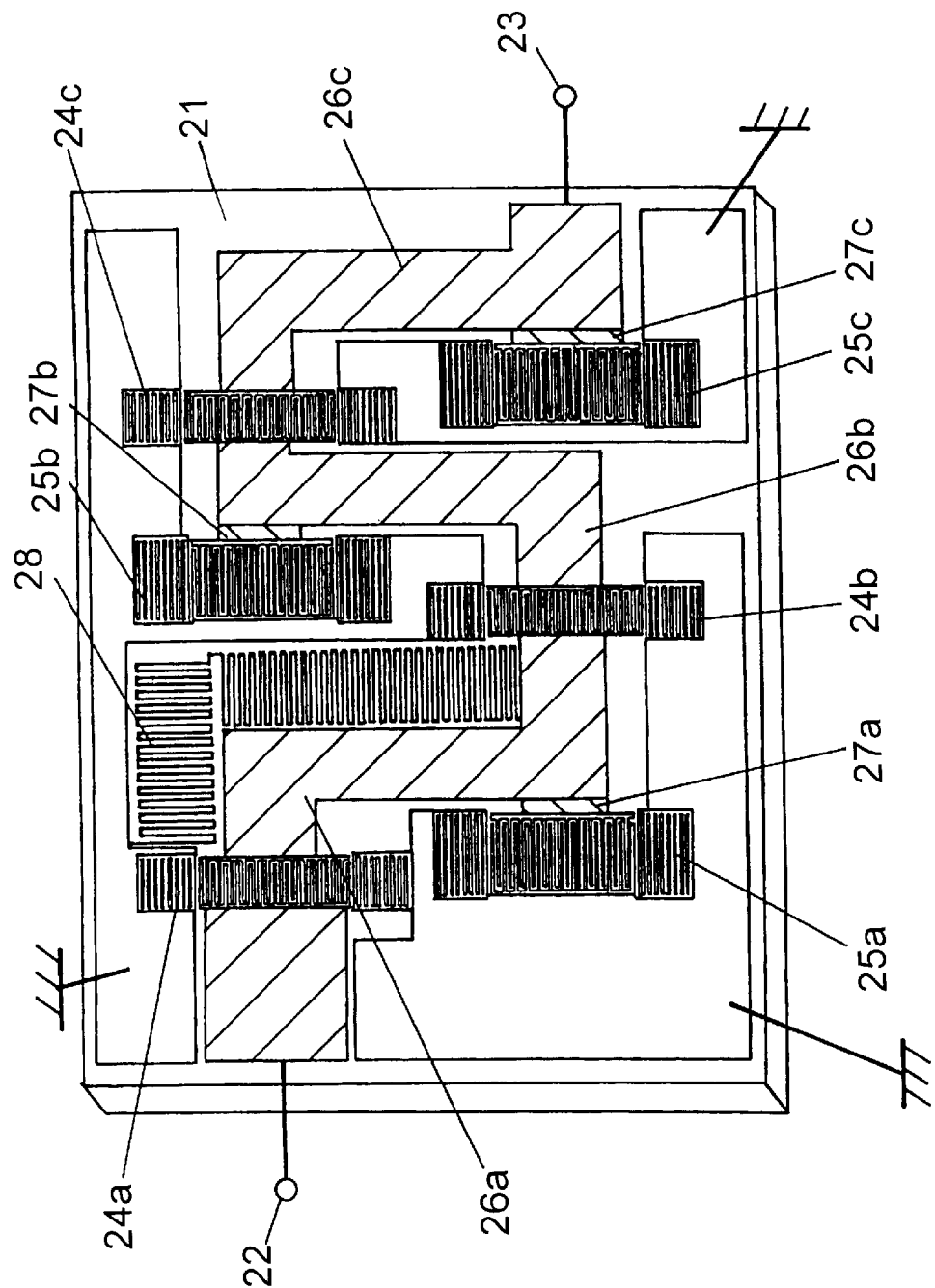
FIG. 10 is a structural diagram showing a constitution of another SAW filter of the embodiment.
Figure 11:
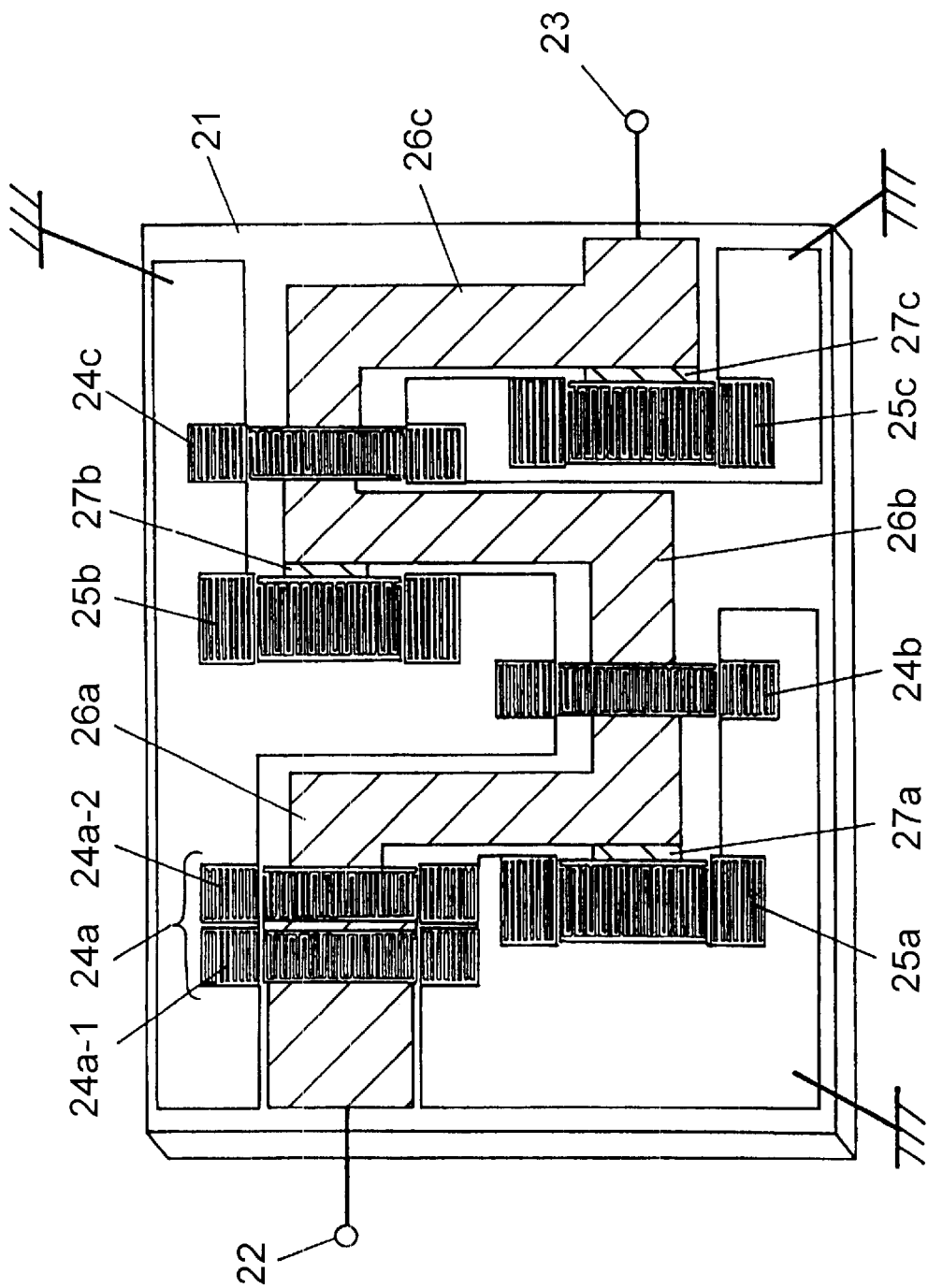
FIG. 11 is a structural diagram showing a constitution of a different SAW filter of the embodiment.
Figure 12:
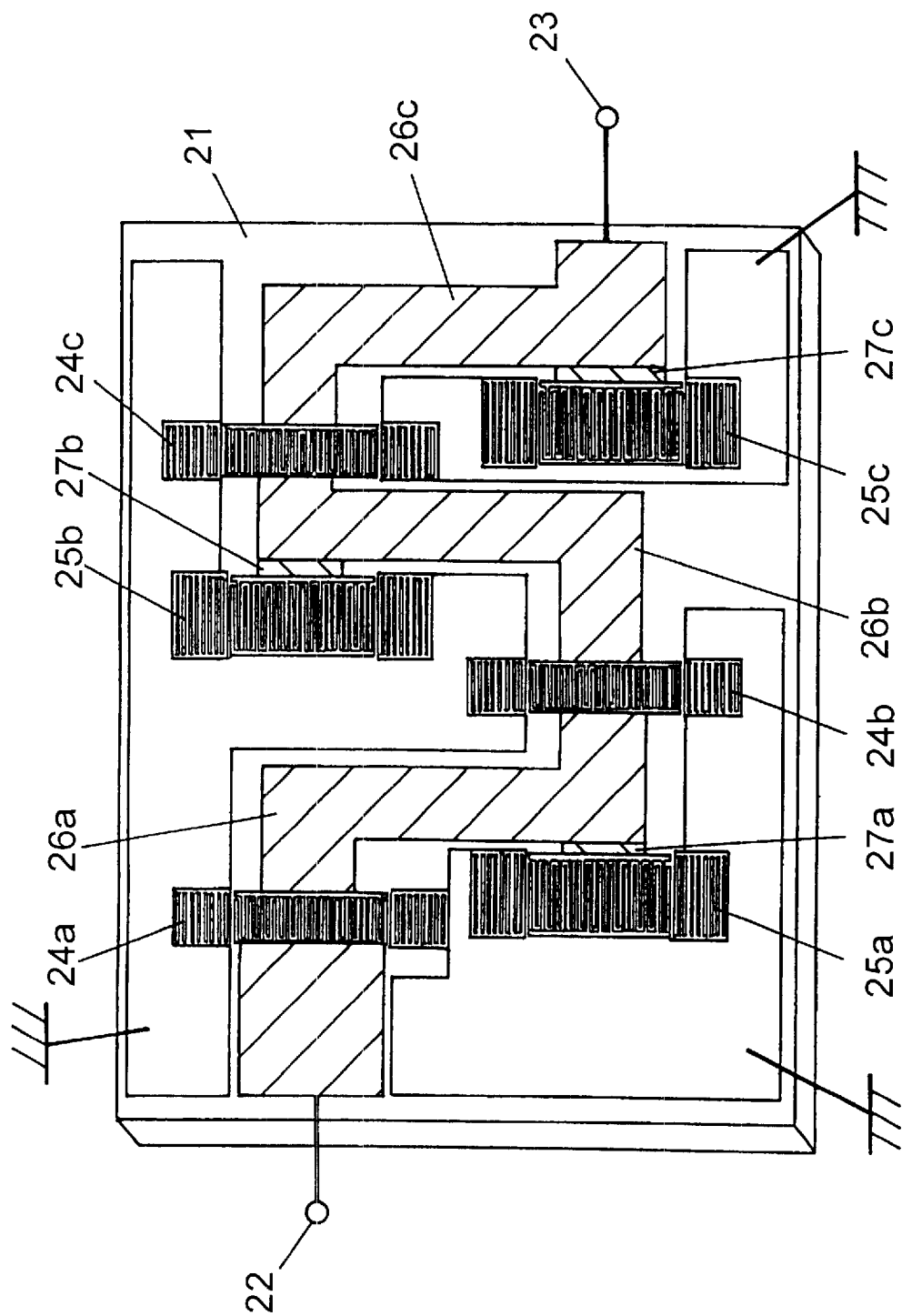
FIG. 12 is a structural diagram showing a constitution of a SAW filter in a comparative example of the embodiment.
Figure 13:
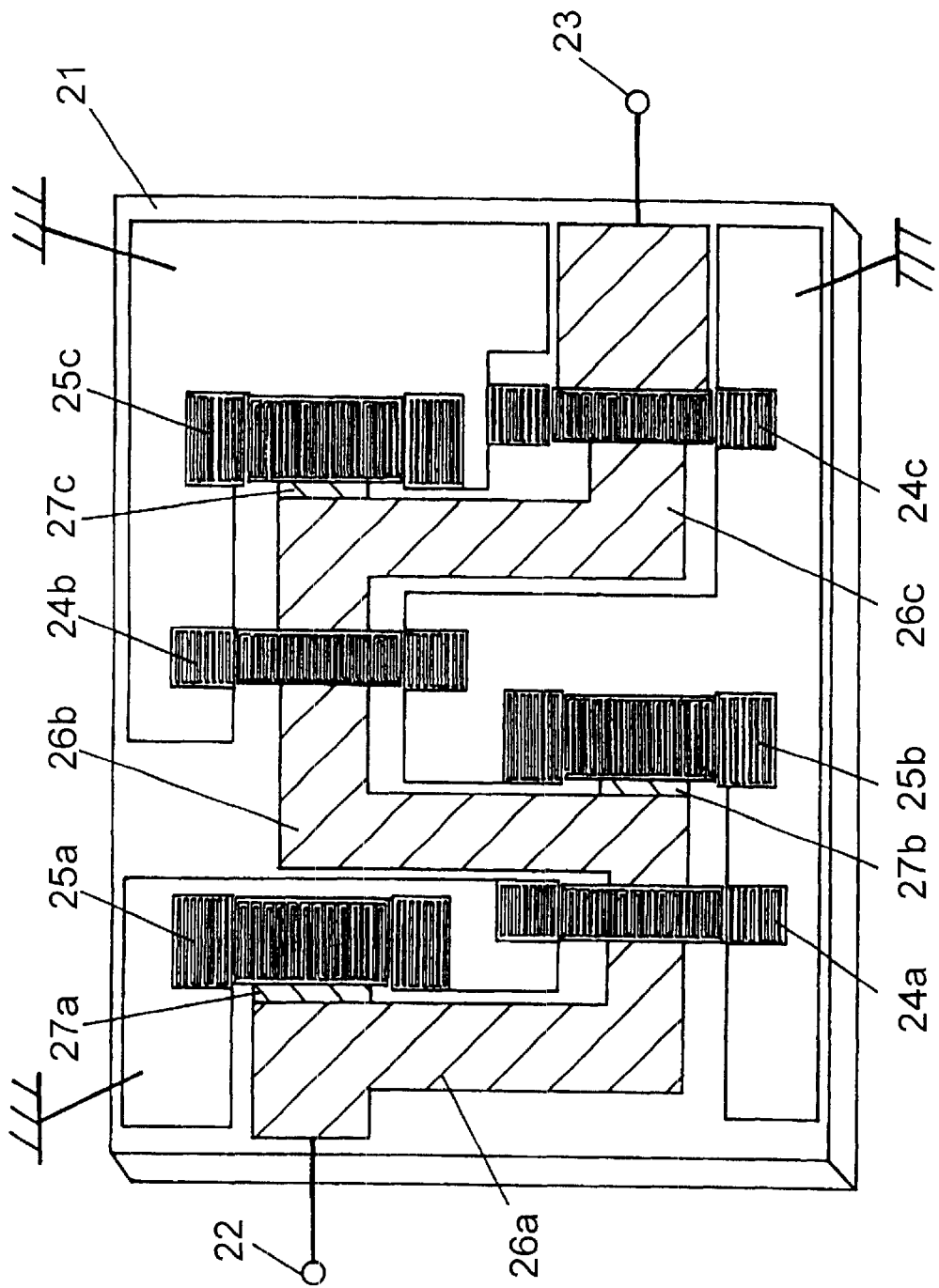
FIG. 13 is a structural diagram showing a constitution of a SAW filter in another comparative example of the embodiment.

A second embodiment of the invention is described below while referring to the drawings. FIG. 9 to FIG. 11 are structural diagrams showing the SAW filter of the embodiment, and FIG. 12 and FIG. 13 show comparative examples. In the diagrams, reference numeral 21 is a piezoelectric substrate, 22 is an input terminal, 23 is an output terminal, 24a to 24c are first to third serial-branch SAW resonators, 25a to 25c are first to third parallel-branch SAW resonators, 26a to 26c are first to third serial-branch wiring patterns, and 27a to 27c are first to third parallel-branch wiring patterns.

The first serial-branch SAW resonator 24a in FIG. 9 to FIG. 12 is provided in the first stage at input side, and the first serial-branch SAW resonator 24a in FIG. 9 and FIG. 11 has two SAW resonators 24a-1 and 24a-2 connected in series. These two SAW resonators 24a-1 and 24a-2 are divided in order to realize the characteristic of the first serial-branch SAW resonator 24a in FIG. 12 and FIG. 13 by connecting the two SAW resonators 24a-1 and 24a-2 in series, and in the embodiment the SAW resonators 24a-1 and 24a-2 are composed of the identical resonators. At this time, since two stages are connected in series, the capacitance of one resonator must be doubled in order to maintain the original characteristic, and the capacitance is increased by doubling the number of electrode pairs in the Interdigital Transducer (hereinafter called IDT).

The second serial-branch SAW resonator 24b in FIG. 9 has two SAW resonators 24b-1 and 24b-2 connected in series, and they are divided in order to realize the characteristic of the second serial-branch SAW resonator 24b in FIG. 10 to FIG. 13 by connecting the two SAW resonators 24b-1 and 24b-2 in series, and in the embodiment the SAW resonators 24b-1 and 24b-2 are composed of the identical resonators. At this time, since two stages are connected in series, the capacitance of one resonator must be doubled in order to maintain the original characteristic, and the capacitance is increased by doubling the number of electrode pairs in the IDT.

In other SAW resonators in FIG. 9 to FIG. 13, SAW resonators of same reference numeral are composed of identical SAW resonators. In FIG. 10, a meander pattern 28 is provided in part of the first serial-branch wiring pattern 26a as a signal path for connecting the first parallel-branch SAW resonator 25a disposed at the position closest to the input side with the first and second serial-branch SAW resonators 24a, 24b, and it is connected to the ground electrode with high impedance.

In the embodiment, as the piezoelectric substrate 21, a 36° Y-cut lithium tantalate substrate is used, and Al-1 wt. % Cu alloy is used as the electrode material. The invention is not limited to the materials of this embodiment alone, but the piezoelectric substrate 21 may be made of a 39° Y-cut lithium tantalate substrate, or the electrodes may be formed by alternately accumulating titanium and aluminum in order to enhance the withstanding power characteristics, or formed by alternately accumulating titanium and Al—Cu alloy or formed by alternately accumulating titanium and Al—Sc—Cu alloy, and the same effects as in the embodiment are obtained.

In FIG. 9 to FIG. 12, the circuit configuration of this SAW filter is a serial-branch input type starting from a first serial-branch SAW resonator 24a at the side of input terminal 22. First to third serial-branch wiring patterns 26a to 26c are arranged zigzag to connect the first to third serial-branch SAW resonators 24a to 24c sequentially, and are bent at the connection points with first to third parallel-branch wiring patterns 27a to 27c.

As a result of this constitution, the first to third parallel-branch wiring patterns 27a to 27c are linear, and their length is shorter than the length of the first to third serial-branch wiring patterns 26a to 26c, respectively. Moreover, in such layout, the first to third serial-branch SAW resonators 24a to 24c and first to third parallel-branch SAW resonators 25a to 25c are placed on the piezoelectric substrates 21 with decreased vacant areas in FIG. 9 to FIG. 11, and therefore the chip size is same as in the prior art.

In these SAW filters of FIG. 9 to FIG. 13, continuous waves of 849 MHz (upper limit frequency of the transmitting band) were applied for 100 hours at a power of 31 dBm, and the withstanding power input test was conducted. In the SAW filters of FIG. 9 to FIG. 12, moreover, the intermittent high power input test was conducted by applying power ranging from 31 dBm to 38 dBm at 0.5 dBm increments for 3 minutes each at interval of two minutes in a total of five times.

Test results and modes of deterioration of resonators in the event of deterioration of electrodes are shown in Table 1.

TABLE 1

| | FIG. 9 | FIG. 10 | FIG. 11 | FIG. 12 | FIG. 13 |
|---|---|---|---|---|---|
| Withstanding power input test 31 dBm, 100 h | Not deteriorated | Not deteriorated | Not deteriorated | Not deteriorated | 4 h (25 a: migration) |
| Intermittent high power input test | Not deteriorated | Not deteriorated | 38 dBm (24 b: discharge) | 36 dBm (24 a: discharge) | — |

Note: ( ) shows the deteriorated SAW resonator and mode of deterioration.

In the filter in FIG. 13 in which deterioration of filter characteristic was observed in 4 hours after start of test, the electrode surface was observed after the test, and protuberances known as hillocks were observed on the top and side surface of the comb-shaped electrodes of the first parallel-branch SAW resonator 25a, which was found to be due to migration of aluminum atoms usually known as the cause of deterioration of electrode. In the filters of FIG. 9 to FIG. 12, the electrode surfaces were observed after the test, but hillocks were not observed. It was found from the results of the withstanding power input test in Table 1 that the serial-branch input type SAW filter has a high withstanding power characteristic.

It may be explained as follows. In the case of the ladder type SAW filter, in the rejection band in the lower outside of receiving band, the parallel-branch SAW resonator has a series resonance, and it is nearly in a short-circuited state. Therefore, in the SAW filter of parallel-branch input type as shown in FIG. 13, the electric power applied in the rejection band in the lower outside of receiving band is directly applied to the first parallel-branch SAW resonator 25a of the first stage, and the comb-shaped electrodes composing the resonator may cause the migration and deteriorate in characteristics.

However, in the case of serial-branch input type SAW filter as shown in FIG. 9 to FIG. 12, at the rejection band in the lower outside of receiving band, the first serial-branch SAW resonator 24a in the first stage function as a capacitive impedance component, and reflects part of the input electric power, thereby preventing excess current from flowing into the first parallel-branch SAW resonator 25a disposed at the position closest to the input terminal of the parallel-branch SAW resonator. For the input of the same electric power, the serial-branch input type SAW filter has a higher withstanding power characteristic as compared with the parallel-branch input type SAW filter.

It is also known from Table 1 that the filters of FIG. 9 and FIG. 10 are not particularly changed if signals of high power are applied instantaneously, while the filters of FIG. 11 and FIG. 12 are deteriorated in the SAW resonators due to discharge at a power of 38 dBm and 36 dBm, respectively. This is because it is a serial-branch input type and a large rf voltage is applied to the comb-shaped electrodes of the first serial-branch SAW resonator 24a in the first stage functioning as a capacitive impedance component against the electric power applied in the rejection band in the lower outside of receiving band, and therefore exceeding a certain voltage, discharge occurs in some comb-shaped electrode in the serial-branch SAW resonator, and the large rf voltage is applied to the entire piece of the first serial-branch SAW resonator 24a of the first stage, and this discharge triggers to induce deterioration of the entire SAW resonator due to discharge.

Incidentally, discharge between comb-shaped electrodes which triggers to discharge the entire SAW resonator is also considered to cause electrostatic damage by pyroelectric charge due to the heat generated by activating the SAW resonators. In particular, when an electric power is applied in the rejection band in the lower outside of receiving band, the heat generation by activation of the SAW resonators is large in the first parallel-branch SAW resonator 25a closest to the input terminal of the parallel-branch resonators, and pyroelectric charge may be generated. Still more, in the case of the ladder-type SAW filter, generally, the parallel-branch resonator is lower in resonance frequency than the serial-branch resonator, and the distance between an electrode and its adjacent electrode of the comb-shaped electrodes is wider, and the capacitance of one resonator is also larger.

In the case of serial-branch input type, moreover, any portion connected to the first serial-branch wiring pattern 26a is not grounded for DC. Accordingly, discharge between comb-shaped electrodes due to pyroelectric charge is likely to occur in the first serial-branch SAW resonator 24a connected to the first parallel-branch SAW resonator 25a closest to the input terminal of the parallel-branch resonators, rather than the first parallel-branch SAW resonator 25a closest to the input terminal of the parallel-branch resonators.

Deterioration of SAW resonators due to discharge largely depends on the amplitude of rf voltage applied between comb-shaped electrodes and pyroelectric charge generated by heat generation by passing of large input power, and hence the filter in FIG. 12 deteriorates due to discharge at 36 dBm in the first serial-branch SAW resonator 24a in the first stage at input side where a large rf voltage is applied, and in the filter of FIG. 9 of which first serial-branch SAW resonator 24a in the first stage at the input side is composed of cascaded two-stage SAW resonators 24a-1 and 24a-2, the rf voltage applied to one resonator is ½ that of before division by cascading, and therefore discharge was not caused by the input power of 36 dBm.

However, in the filter of FIG. 11, at input power of 38 dBm, deterioration due to discharge is observed in the second serial-branch SAW resonator 24b at the output side out of the serial-branch resonators connected to the first parallel-branch SAW resonator 25a closest to the input terminal of the parallel-branch resonators. This is considered because the second serial-branch SAW resonator 24b is composed of cascaded two-stage SAW resonators 24b-1 and 24b-2 similar to the first serial-branch SAW resonator 24a as in the filter of FIG. 9, and it is improved by reducing the rf voltage to about ½, so that discharge is not caused by input power of 38 dBm as shown in Table 1.

As in the case of the filter of FIG. 10, as the meander pattern 28 is formed in part of the first serial-branch wiring pattern 26a as the signal path connecting the first parallel-branch SAW resonator 25a disposed at the position closest to the input side and the first and second serial-branch SAW resonators 24a, 24b, it can be connected to the ground electrode with high impedance, and only the pyroelectric charge can be released to the ground without loss of rf signals, so that generation of discharge can be suppressed even at the input of large power of 38 dBm.

In the embodiment, the first and second serial-branch SAW resonators 24a, 24b are respectively divided into two stages, that is, identical SAW resonators 24a-1, 24a-2, and identical SAW resonators 24b-1, 24b-2, but the number of stages is not limited to two, or the resonators are not required to be identical mutually, and the number of stages and setting of resonators may be properly determined so as not to cause discharge depending on the amplitude of the input rf power. In the filter in FIG. 10, a high impedance line is realized in the meander pattern 28, but not limited to this, it may be constituted so that the first serial-branch wiring pattern 26a may be connected to the ground electrode with high impedance.

Although the input power which exceeds a specific power may cause discharge at the parallel-branch SAW resonator closest to the input side due to the increase of the capacitance in the case of cascaded multi-stage constitution of the serial-branch SAW resonators as in this embodiment, the input power for generating discharge can be heightened on the whole by composing the parallel-branch SAW resonators in a cascaded multi-stage similarly to the serial-branch SAW resonator, so that the withstanding power characteristic can be enhanced.

Exemplary Embodiment 3

Figure 14:
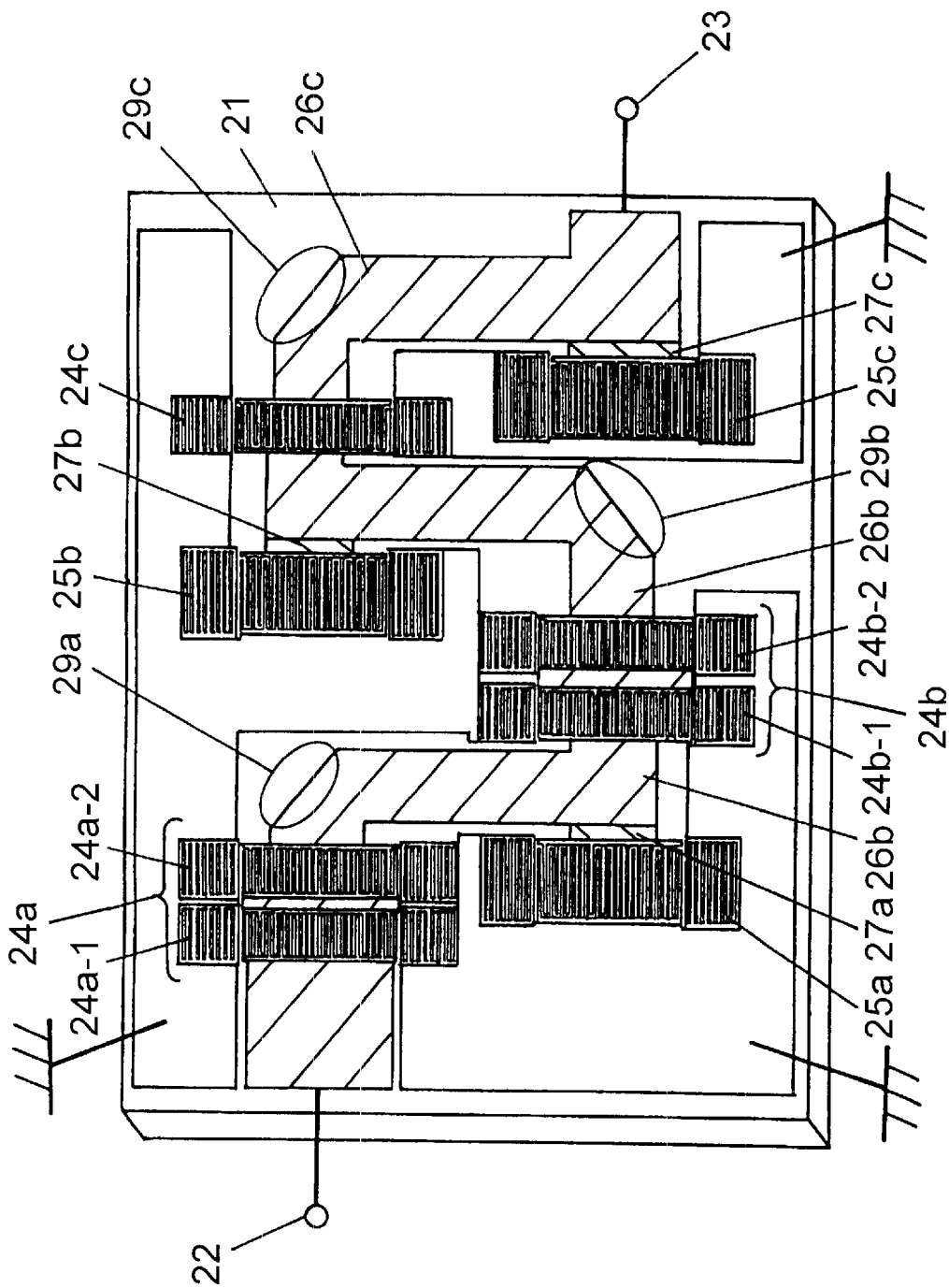
FIG. 14 is a structural diagram showing a constitution of a SAW filter in a third embodiment of the invention.
Figure 15:
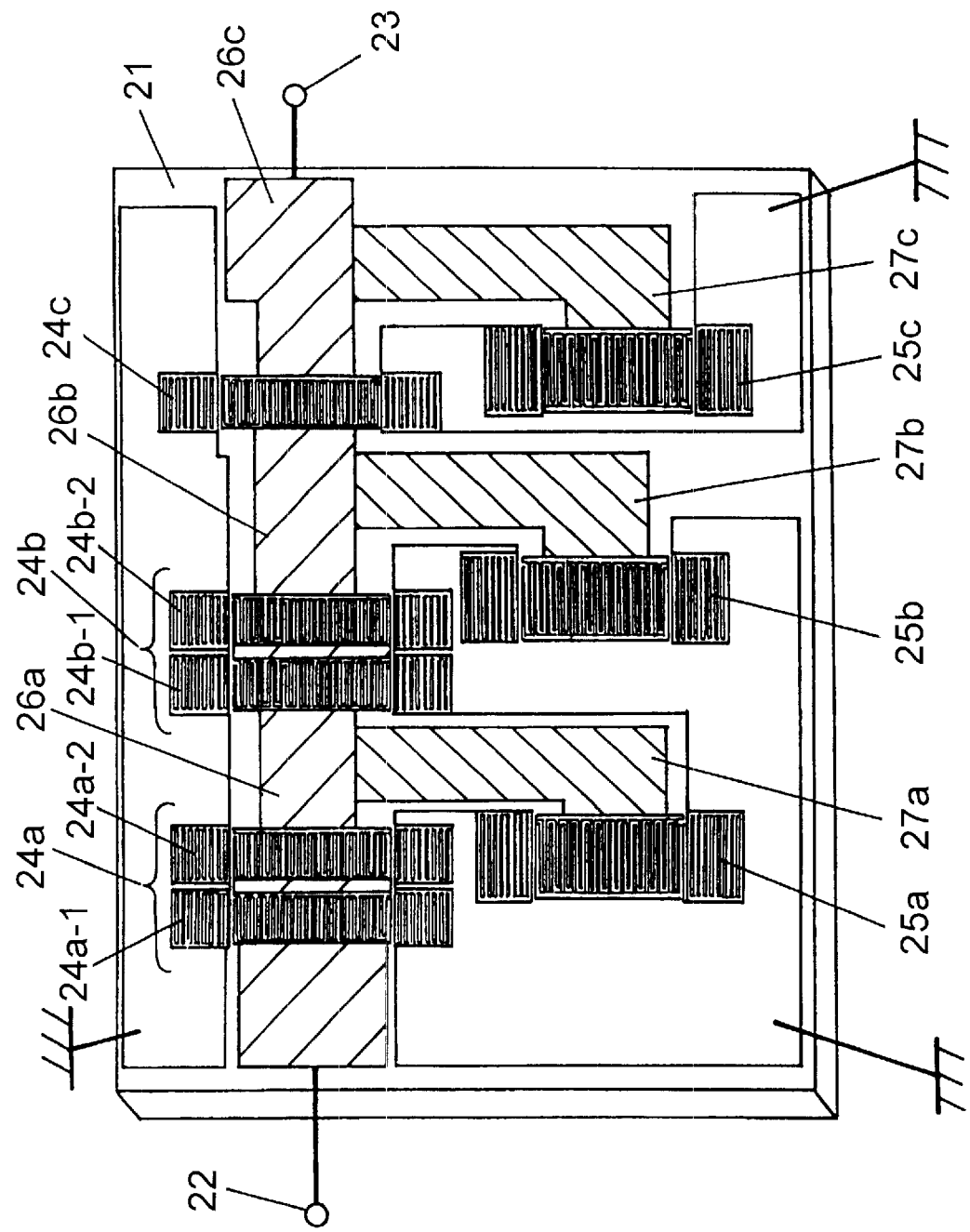
FIG. 15 is a structural diagram showing a SAW filter in a comparative example of the embodiment.

A third embodiment of the invention is described below while referring to the drawings. FIG. 14 is a structural diagram showing the SAW filter of the embodiment, and SAW filters shown in FIG. 9 and FIG. 15 are used as comparative examples. All filters are band-pass filters with the pass-band ranging from 869 MHz to 894 MHz (marker M1 to M2), and set as receiving filters conforming to the AMPS of the United States mobile telephone system.

In the diagrams, reference numeral 21 is a piezoelectric substrate, 22 is an input terminal, 23 is an output terminal, 24a to 24c are first to third serial-branch SAW resonators, 25a to 25c are first to third parallel-branch SAW resonators, 26a to 26c are first to third serial-branch wiring patterns, and 27a to 27c are first to third parallel-branch wiring patterns. The SAW resonators shown in FIG. 14 and FIG. 15 are composed of identical SAW resonators in the SAW resonators having same reference numerals as in FIG. 9, and the piezoelectric substrate 21 is composed of a 36° Y-cut lithium tantalate substrate, and Al-1 wt. % Cu alloy is used as the electrode material.

The invention is not limited to the materials of this embodiment alone, but the piezoelectric substrate 21 may be made of a 39° Y-cut lithium tantalate substrate, or the electrodes may be formed by alternately accumulating titanium and aluminum in order to enhance the withstanding power characteristics, or formed by alternately accumulating titanium and Al—Cu alloy or formed by alternately accumulating titanium and Al—Sc—Cu alloy, and the same effects as in the embodiment are obtained.

In the diagrams, the circuit configuration of any SAW filter is a serial-branch input type starting from a first serial-branch SAW resonator 24a at the side of input terminal 22. However, in the SAW filters in FIG. 14 and FIG. 9, first to third serial-branch wiring patterns 26a to 26c are arranged zigzag to connect the first to third serial-branch SAW resonators 24a to 24c sequentially, and are bent at the connection points with first to third parallel-branch wiring patterns 27a to 27c.

Figure 16:
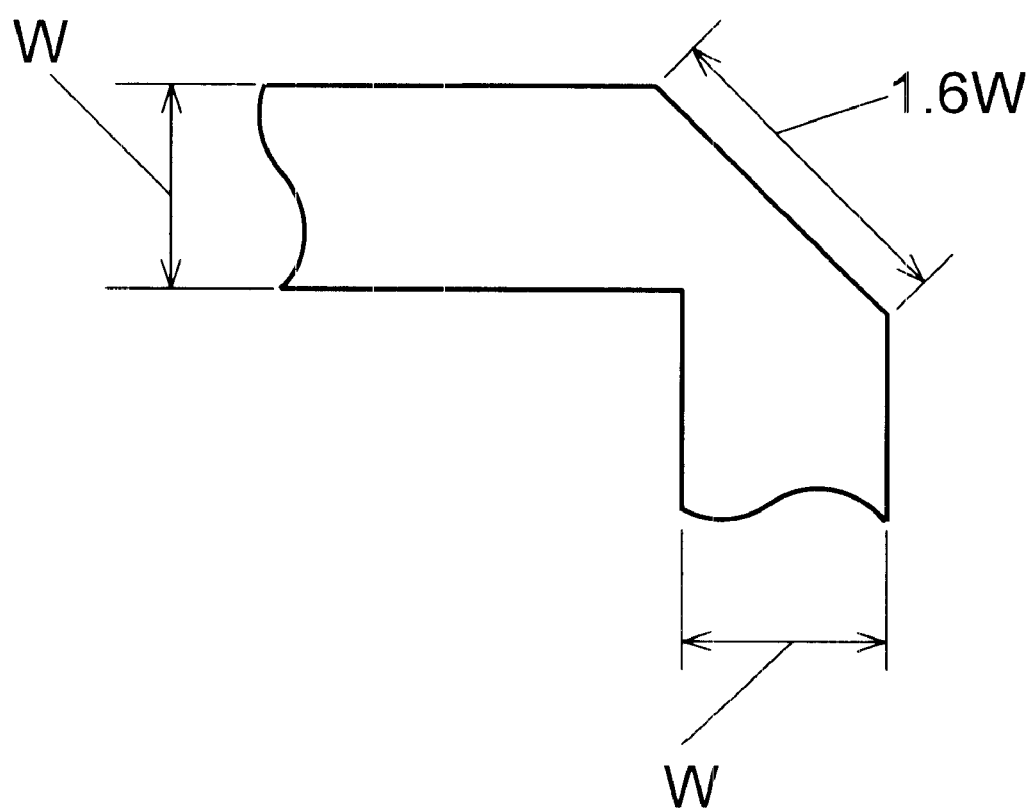
FIG. 16 is a magnified view of bend transformation in the embodiment.
Figure 17:
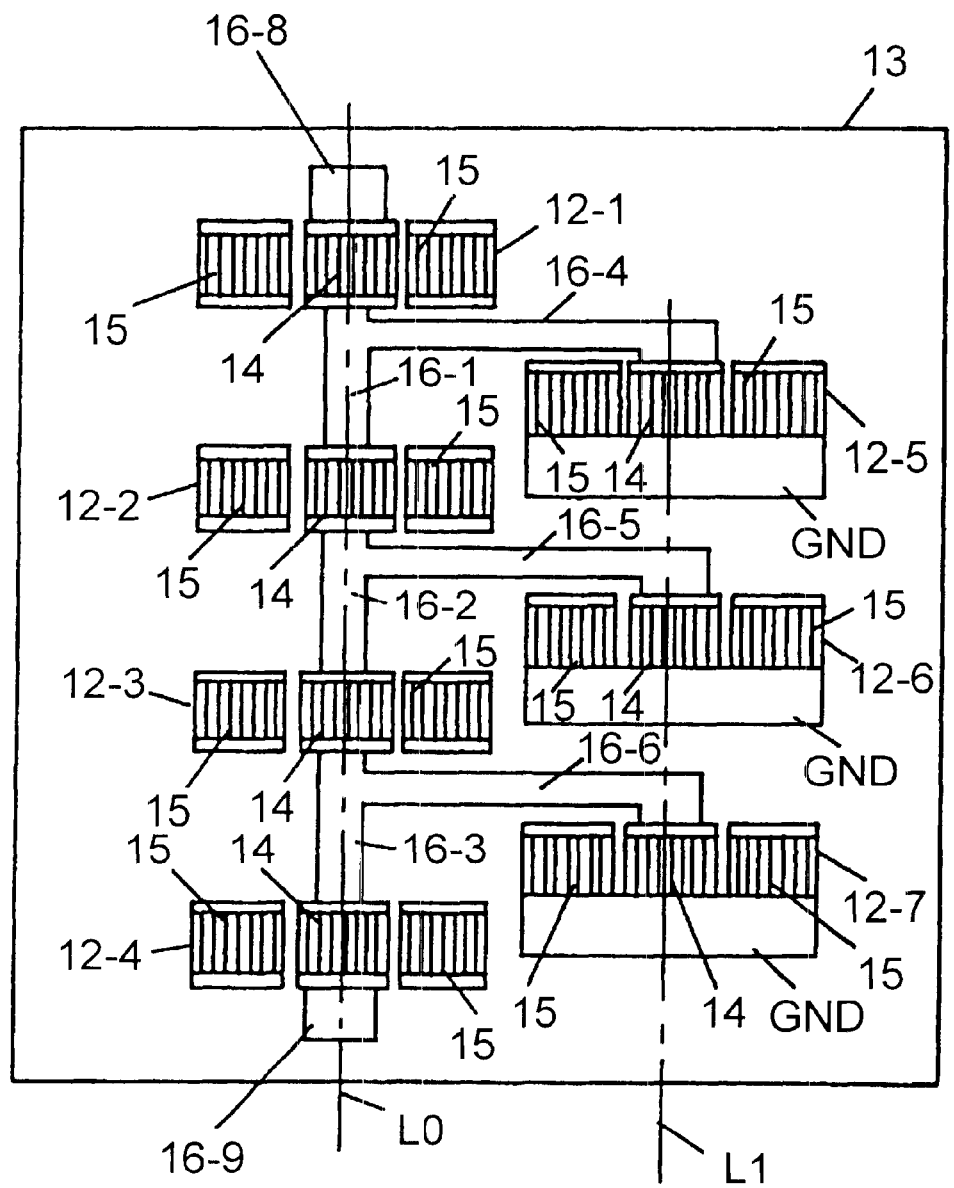
FIG. 17 is a structural diagram showing a constitution of a SAW filter in a prior art.

In the embodiment, the first to third serial-branch wiring patterns 26a to 26c and the first to third parallel-branch wiring patterns 27a to 27c are constituted so that the width of wiring may be always constant. In FIG. 14, moreover, wiring corners 29a to 29c in the first to third serial-branch wiring patterns 26a to 26c are bent. In this bent transformation, the length of bending portion is 1.6 W as shown in FIG. 16, where W is the width of wiring patterns.

The minimum value and maximum value of insertion loss of the filters in FIG. 14, FIG. 9 and FIG. 15 are shown in Table 2.

TABLE 2

|  | FIG. 14 | FIG. 9 | FIG. 15 |
|---|---|---|---|
| Insertion loss (min.) | 1.9 dB | 2.1 dB | 1.8 dB |
| Insertion loss (max.) | 3.2 dB | 3.5 dB | 3.2 dB |

It is known from Table 2 that, in the filter of FIG. 9 the first to third serial-branch wiring patterns 26a to 26c are wiring zigzag so as to connect the first to third serial-branch SAW resonators 24a to 24c sequentially, and are bent at the connection points with the parallel-branch wiring patterns 27a to 27c, and therefore the insertion loss is poor as compared with the SAW filter in FIG. 15, but it can be improved by bend transformation as shown in the filter of FIG. 14.

In the embodiment, the width W of the wiring pattern is constant, but it is not always required, and the length of bending portion is 1.6 W, but it is not always required, and anyway the bend transformation may be processed so that the insertion loss may be smaller at the corners of the wiring patterns.

Industrial Applicability

As described herein, the invention brings about a ladder-type SAW filter composed by connecting alternately a serial branch having at least one SAW resonator connected in series to a signal path, and a parallel branch having at least one SAW resonator connected between the signal path and the ground, in which the sizes of wiring patterns of the parallel branch are smaller than wiring patterns of the serial branch, and therefore even in the case of the serial-branch input type, a large reflection coefficient is assured in the rejection band, thereby realizing a SAW filter with a high withstanding power characteristic and a sufficient isolation between the transmitting terminal and receiving terminal, an antenna duplexer using the same, and a mobile communication terminal using the same.

What is claimed is:

1. A Surface Acoustic Wave (SAW) filter comprising:
a plurality of serial-branches, each having a SAW resonator, which are connected in series in a signal path with a plurality of wiring patterns, and
a plurality of parallel-branches, each having a further SAW resonator connected between the signal path and a ground with a plurality of further wiring patterns, and connected with each of said plurality of serial-branches alternately,
wherein the SAW resonators of the serial-branches and the SAW resonators of the parallel-branches are alternately and oppositely disposed along parallel axes, and the sizes of any of said plurality of further wiring patterns are smaller than the sizes of any of said plurality of wiring patterns.

2. The SAW filter of claim 1, wherein at least one of the further wiring patterns of said plurality of parallel-branches is linear-shaped, and at least one of the wiring patterns of said plurality of serial-branches is bent at a connecting portion with one of said wiring patterns of one of said parallel-branches.

3. The SAW filter of claim 1, wherein an input terminal is connected with the serial-branch disposed at the closest position to said input terminal.

4. The SAW filter of claim 1, wherein an input terminal is connected to the first serial-branch disposed at the closest position to said input terminal, and
said first serial-branch has a plurality of SAW resonators.

5. The SAW filter of claim 1, wherein an input terminal is connected to the first serial-branch disposed at the closest position to said input terminal,
said first serial-branch has a plurality of SAW resonators, and
the second serial-branch connected next to said first serial branch has a plurality of SAW resonators.

6. The SAW filter of claim 1, wherein a bend transformation is made in at least one of the plurality of wiring patterns or of the plurality of further wiring patterns.

7. An antenna duplexer having the SAW filter of claim 1 placed between an antenna terminal and a receiving terminal.

8. The antenna duplexer of claim 7, wherein a phase shifter of high-pass filter type is placed between the antenna terminal and a receiving filter.

9. The antenna duplexer of claim 8, wherein the phase shifter is formed of a circuit composed of series capacitance and shunt inductance.

10. The antenna duplexer of claim 8, wherein the phase shifter is formed of a T-circuit composed of series capacitance and shunt inductance.

11. A mobile communication terminal using the antenna duplexer of claim 7.

12. A Surface Acoustic Wave (SAW) filter, comprising:
a plurality of serial-branches, each having a SAW resonator, which are connected in series in a signal path with a plurality of wiring patterns, and
a plurality of parallel-branches, each having a further SAW resonator connected between the signal path and a ground with a plurality of further wiring patterns, and connected with each of said plurality of serial-branches alternately;
an input terminal is connected to the first serial-branch disposed at the closest position to said input terminal, and
a signal path connecting the SAW resonator
of said first serial-branch with the SAW resonator of the parallel-branch is grounded with high impedance,
wherein the sizes of any of said plurality of further wiring patterns are smaller than the sizes of any of said plurality of wiring patterns.

* * * * *

UNITED STATES PATENT AND TRADEMARK OFFICE
CERTIFICATE OF CORRECTION

| | | |
|---|---|---|
| PATENT NO. | : 6,445,261 B1 | Page 1 of 1 |
| DATED | : September 3, 2002 | |
| INVENTOR(S) | : Naoki Yuda et al. | |

It is certified that error appears in the above-identified patent and that said Letters Patent is hereby corrected as shown below:

Column 14,
Line 36, before "circuit" insert -- π- --.

Signed and Sealed this

Fourth Day of March, 2003

JAMES E. ROGAN
*Director of the United States Patent and Trademark Office*